(12) United States Patent
Zaal et al.

(10) Patent No.: US 7,110,085 B2
(45) Date of Patent: Sep. 19, 2006

(54) LITHOGRAPHIC APPARATUS, SUBSTRATE HOLDER AND METHOD OF MANUFACTURING

(75) Inventors: Koen Jacobus Johannes Maria Zaal, Eindhoven (NL); Tjarko Adriaan Rudolf Van Empel, Eindhoven (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 10/839,720

(22) Filed: May 6, 2004

(65) Prior Publication Data
US 2004/0247361 A1    Dec. 9, 2004

(30) Foreign Application Priority Data
May 6, 2003    (EP)    ................................... 03076340

(51) Int. Cl.
*G03B 27/42*    (2006.01)
*G03B 27/58*    (2006.01)
*G03B 27/60*    (2006.01)
*B25B 11/00*    (2006.01)

(52) U.S. Cl. ............................. 355/53; 355/72; 355/73; 269/21

(58) Field of Classification Search .................. 355/53, 355/72, 73; 269/21
See application file for complete search history.

(56) References Cited

U.S. PATENT DOCUMENTS

| 5,229,872 | A | 7/1993 | Mumola |
|---|---|---|---|
| 5,296,891 | A | 3/1994 | Vogt et al. |
| 5,324,012 | A | 6/1994 | Aoyama et al. |
| 5,523,193 | A | 6/1996 | Nelson |
| 5,969,441 | A | 10/1999 | Loopstra et al. |
| 6,046,792 | A | 4/2000 | Van Der Werf et al. |
| 6,232,615 | B1 * | 5/2001 | Van Empel .................. 250/548 |
| 6,710,857 | B1 * | 3/2004 | Kondo ......................... 355/72 |
| 2002/0008864 | A1 | 1/2002 | Kondo |

FOREIGN PATENT DOCUMENTS

EP    0 047 884 A2 *    10/1999

(Continued)

*Primary Examiner*—Alan Mathews
(74) *Attorney, Agent, or Firm*—Pillsbury Winthrop Shaw Pittman LLP

(57) ABSTRACT

A lithographic projection apparatus including a radiation system for providing a projection beam of radiation; a support structure for supporting a patterning device, the patterning device serving to pattern the projection beam according to a desired pattern; a substrate holder having a plurality of protrusions, the extremities thereof defining a substantially flat plane of support for supporting a substantially flat substrate, the substrate holder provided with the ability to provide a pressing force for pressing the substrate against the extremities of the protrusions, the protrusions in an edge zone of the substrate holder arranged to provide a substantially flat overhanging of the substrate in relation to the pressing force of the pressing means; and a projection system for projecting the patterned beam onto a target portion of the substrate. The lithographic projection apparatus is characterized in that the protrusions in an off-edge zone of the substrate holder are distributed so as to provide a substantial equal supporting area for each protrusion of the plurality of protrusions, the supporting areas being defined by a Voronoi diagram distribution associated to the protrusions. The lithographic apparatus offers a substrate holder with a reduced overlay and focus error.

20 Claims, 6 Drawing Sheets

FOREIGN PATENT DOCUMENTS

| | | |
|---|---|---|
| EP | 0 947 884 A2 | 10/1999 |
| EP | 0 947 884 A3 | 7/2001 |
| JP | 2001-60617 | 3/2001 |
| WO | WO98/33096 | 7/1998 |
| WO | WO98/38597 | 9/1998 |
| WO | WO98/40791 | 9/1998 |

* cited by examiner

LITHOGRAPHIC APPARATUS, SUBSTRATE HOLDER AND METHOD OF MANUFACTURING

The present application claims priority from EP Application No. 03076340.3 filed May 6, 2003, the content of which is incorporated herein by reference in its entirety.

FIELD OF THE INVENTION

The present invention relates to a lithographic apparatus. The present invention further relates to a substrate holder. The present invention further relates to a method of manufacturing.

The present invention further relates to a lithographic projection apparatus comprising a radiation system for providing a projection beam of radiation; a support structure for supporting patterning devices, the patterning devices serving to pattern the projection beam according to a desired pattern; a substrate holder comprising a plurality of protrusions, the extremities thereof defining a substantially flat plane of support for supporting a substantially flat substrate, said substrate holder provided with a clamp to provide a pressing force for pressing the substrate against the extremities of the protrusions; the protrusions in an edge zone of the substrate holder arranged to provide a substantially flat overhanging of the substrate in relation to the pressing force of the clamp; and a projection system for projecting the patterned beam onto a target portion of the substrate.

RELATED ART

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the substrate holder will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by a employing piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereinabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said substrate holder may be embodied as a frame or table, for example, which may be fixed or movable as required; and A programmable LCD array. An example of such a construction is given in U.S. Pat. No. 5,229,872, which is incorporated herein by reference. As above, the substrate holder in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereinabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

Due to the extreme narrow tolerances in a lithographic process it has become more and more a necessity to insure absolute flatness of a substrate when treated in a photolithographic apparatus, since a small deviation from ideal flatness may already result in degrading of the image resolution that is achieved in the photolithographic process. New generations of photolithographic imaging techniques aim for resolutions of 70 nm or even down to 15 nm or less. In such circumstances, a minute unevenness of a flat substrate may already cause detectable shifts that are detrimental to focus and overlay resolution.

In this respect a focus error is defined as the vertical deviation of an ideal plane of focus. An overlay error is defined as a sideways shift of the image with respect to the plane of focus, and may be caused by tiny bending of the surface of the substrate. Such a bending introduces a rotation of the wafer plane with respect to the focus plane, so that the image is projected slightly sideways thereof compared to the normal in-focus image. A measure for such an overlay error is the rotation angle of the normal times half the thickness of the substrate.

European patent application EP0947884 describes a lithographic apparatus having a substrate holder wherein protrusions are arranged to improve the flatness of the substrate. These protrusions have a general diameter of 0.5 mm and are located generally at a distance of 3 mm away from each other and thereby form a bed of supporting members that support the substrate. Due to the relative large spaces in between the protrusions, contaminations possibly present generally do not form an obstruction for the flatness of the substrate, since these will be lying in between the protrusions and will not lift the substrate locally. Especially in the vicinity of the boundary regions, the abovementioned application improves the flatness of such a distribution of pins. In these regions, due to the suction force exerted by a "leak-seal" that is applied, the substrate tends to be slightly bended away from an ideal flat orientation.

However, it has come to the attention of the inventors, that especially the arrangement of the supporting members in the zone away from the edge, a so called off-edge zone, offers room for improvement, since the existing arrangements have a tendency to provide an uneven load to the supporting protrusions of the substrate holder. In order to improve the flatness of the substrate still further when supported by the substrate holder, the invention has as one of its objects to provide a lithographic apparatus having a substrate holder that has improved distribution of supporting pins.

SUMMARY

In order to achieve the object, the photolithographic apparatus of the invention is arranged according to the features of claim 1. By distributing the protrusions in the center zone of the substrate holder according to a Voronoi diagram distribution associated with the protrusions, the supporting load for each protrusion of the plurality of protrusions is substantially equal. Such a Voronoi diagram distribution may be viewed as a collection of adjacent areas that are formed by division lines that divide a connecting line connecting each two neighboring protrusions midway. Since, viewed from a protrusion central to such an area, in relation to each neighboring protrusion, the load is divided in equal parts between the central protrusion and the neighboring protrusion, an even load results that is substantially equal for each supporting protrusion of the distribution of center protrusions.

Although, from a "normal" physical perspective, such protrusions may be regarded as stiff bodies, in terms of very minute deviations, these protrusions possess natural elastic properties that causes the height to fluctuate in accordance with the load exerted thereon. Since the invention offers the benefit of providing a much more even load distribution among the protrusions, a height distribution of these protrusions of the inventive photolithographic apparatus is centered in a much narrower peak around an intended average height value. Thus, a substrate holder according to this "Voronoi criterion" defined in claim 1 results in a reduced irregularity in the way the substrate is deformed, resulting in a substantially even position of the substrate that can be positioned ideally in the plane of focus without local distortions of focus errors or overlay errors.

Thus, in the apparatus of the invention, an even greater flatness of the substrate is achieved, resulting in better image resolution qualities. It has been found that by the improved distribution, a local focus error could be reduced significantly in relation to the known regular distributions.

In a preferred embodiment, the substrate holder is a substantially circular structure for supporting a substantially circular substrate and wherein the plurality of protrusions is arranged in substantially concentric circles in a zone away from a central zone of the circular substrate holder; wherein at least some concentric circles are non-equidistant. A concentric arrangement of circular sets of protrusions is also generally known from the aforesaid publication EP-0947884; however, in accordance with the invention, the radial separation of the two circles is non-equidistant to provide room for an integer number of extra protrusions per subsequent circle, while still maintaining the "Voronoi criterion" of the inventive photolithographic apparatus.

In a further preferred embodiment, the protrusions are distributed in substantially equilateral triangular patterns. With a substantially equilateral triangular pattern a triangular mesh is meant, wherein more than 80%, preferably more than 95% of the triangles are more than 80%, preferably more than 95% equilateral triangles, that is, these triangles have legs that have lengths within 10% of an average leg length of each triangle.

In even a further preferred embodiment it has been found that in the central zone, where the generally concentric circles of protrusions are more like polygonal structures, preferably, the center protrusions are arranged according to a regular hexagonal shape. That is, preferably, no smaller ring than six protrusions is used, wherein the six protrusions form a regular hexagonal structure. In addition, the second row of protrusions is arranged to have 12 protrusions oriented substantially symmetrical around the central hexagonally arranged protrusions.

It has been found preferential, when the substrate holder comprises a plurality of N openings, each of the openings defining a second edge zone, wherein each concentric circle traversing the N second edge zones comprises an integer number of N protrusions. In this way, the design of a single opening can be transferred easily to another opening without needing to redesign the edge zone near the opening. Preferably, the plurality of N openings is arranged in an N/3 multiple of sets of three symmetrically configured openings. Such triplets of openings can be used as guiding passages for ejection pins, which may lift the substrate from the substrate holder when loading or unloading the substrate. It may be viewed as a separate invention that in the substrate holder, these N openings are designed as N/3 multiple triplets wherein for different types of lithographic apparatuses having differently dimensioned ejection pins a substrate holder can be designed independent from the machine, having a reproducible flatness for all pin-layouts.

In addition, preferably, the substrate holder comprises a plurality of M notches, each of the notches defining a third edge zone, wherein each concentric circle traversing the M third edge zones comprises an integer number of M protrusions. These notches are used as orientation marks for a substrate handler, and are distortional to an ideal circular arrangement of protrusions. In the inventive design, the distortion of one notch can be copied easily to all other notches, so that the design can be simplified.

Although the invention is quite independent from the specific clamp that may be used to generate a pressing force, preferably the clamp is a vacuum system that generates a vacuum pressure to apply the pressing force. The vacuum pressure is provided by having the edges of the substrate holder formed by a wall for providing a leak seal. In this way, a vacuum pressure is applied between the substrate holder and the substrate. Other known clamps that apply a pressing force can also be used.

Preferably, the vacuum pressure ranges from 0.1 to 0.9 bar with respect to ambient pressure. More in particular, the vacuum pressure ranges from 0.5 to 0.2 bar with respect to ambient pressure. It has been found that preferably, the vacuum pressure is minimal while offering still a good pressing force to press the substrate against the substrate holder.

In still a further preferred embodiment, in such a "leak-seal" arrangement comprising a wall, a radial distance x between the wall and the circle nearest thereto satisfies the relationship $0.3 < x/d < 0.6$, where d is the mutual radial separation of the two circles nearest to the wall. According to the above, the edge zone is defined by a set of protrusions where the Voronoi area extends beyond the edge. For a concentric pattern, this amounts to the one concentric circle of protrusions arranged nearest to an edge. Furthermore, the "edge" is defined as the boundary separates the clamping area and an area where no clamping is present.

The invention further relates to a substrate holder according to any of the above mentioned aspects.

The invention further relates to a method of manufacturing a substrate holder for a lithographic apparatus, comprising the steps of: providing a plate for supporting a substantially flat substrate; distributing a plurality of supporting protrusions in an off-edge zone of the plate so as to provide a substantial equal supporting area for each protrusion of the plurality of protrusions, the extremities of the protrusions defining a substantially flat plane of support; arranging a plurality of supporting protrusions in an edge zone of the plate so as to provide a substantially flat overhanging of the substrate in relation to the pressing force of the clamp; and calculating a supporting area distribution defined by a Voronoi diagram associated to the protrusions and keeping the area deviation of the supporting area distribution to a minimum.

According to one aspect, the method further comprises the steps of a) calculating a height distribution of the substrate in correspondence with a pressure exerted on the substrate to press the substrate against the plurality of distributions and to deform the protrusions locally in axial directions; b) analyzing the focus error and an overlay error associated to the height distribution; and c) redistributing the supporting protrusions in the areas wherein the focus and/or overlay error exceeds a predefined maximum value and repeating steps a–c in an iterative way.

According to another aspect, in the method, the height distribution is calculated in correspondence with a finite element analysis of the bending stiffness of the wafer.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
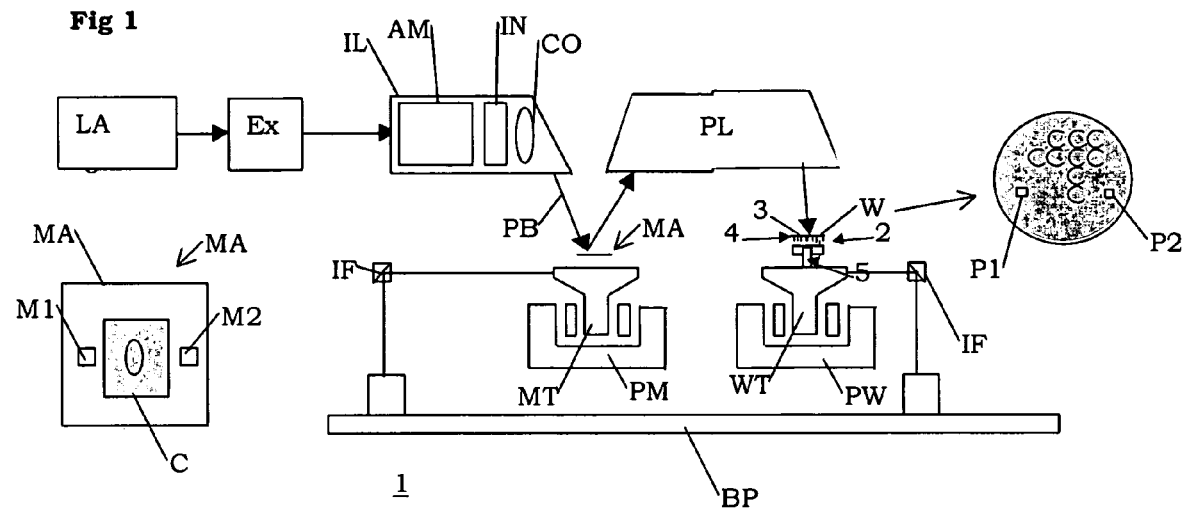
FIG. 1 depicts a lithographic projection apparatus according to an embodiment of the invention.

FIG. 1 schematically depicts a lithographic projection apparatus 1 according to a particular embodiment of the invention. The apparatus comprises:

a radiation system Ex, IL, for supplying a projection beam PB of radiation (e.g. light in the deep ultraviolet region). In this particular case, the radiation system also comprises a radiation source LA;

a first object table (mask table) MT provided with a mask holder for holding a mask MA (e.g. a reticle), and connected to first positioning devices PM for accurately positioning the mask with respect to item PL;

a second object table (substrate table) WT provided with a substrate holder 2 for holding a substrate 3, and connected to second positioning devices PW for accurately positioning the substrate with respect to item PL; and a projection system ("lens") PL for imaging an irradiated portion of the patterning device, illustrated in the form of the mask MA onto a target portion C (e.g. comprising one or more dies) of the substrate 3.

As here depicted, the apparatus is of a reflective type (i.e. has a reflective mask). However, in general, it may also be of a transmissive type, for example (with a transmissive mask). Alternatively, the apparatus may employ another kind of patterning devices, such as a programmable mirror array of a type as referred to above.

The source LA (e.g. an excimer laser source) produces a beam of radiation. This beam is fed into an ILlumination system (illuminator) IL, either directly or after having traversed conditioning devices, such as a beam expander Ex, for example. The illuminator IL may comprise adjusting devices AM for setting the outer and/or inner radial extent (commonly referred to as s-outer and s-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate 3. With the aid of the second positioning device PW (and interferometric measuring devices IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate 3 may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As depicted in FIG. 1, the substrate holder 2 comprises a plurality of supporting pin-form protrusions 4 that have a general height of about 100 µm. This height however is not considered limiting for the invention but may have other values without departing from the scope of the invention. The substrate holder 2 defines a substantially flat plane of support for supporting the substantially flat substrate 3. Schematically depicted is a vacuum system 5, that presses the substrate against the extremities of the protrusions 4. Although in this example a vacuum suction force is used to provide a pressing force, the invention is not limited thereto.

Figure 2:
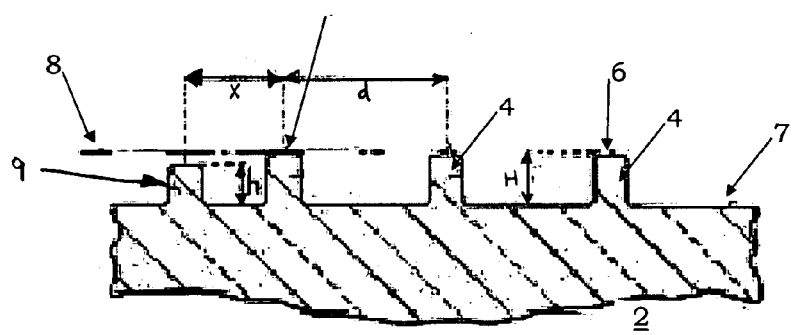
FIG. 2 depicts a detail in cross sectional view of a substrate holder for use in an apparatus according to FIG. 1.

FIG. 2 shows a detail of a substrate holder as depicted in FIG. 1 in cross sectional view. The substrate holder 2 of FIG. 2 comprises support pins 4 (e.g. cylindrical burls) having a height H of approximately 100 µm. The burls are spaced apart from each other at a distance of approximately 3 mm. The burls 4 have a diameter of approximately 0.5 mm. Each protrusion has an extremity 6 remote from the face 7 of the substrate holder 2 and is thus embodied (dimensioned) that the extremities 6 all lie within a single substantially flat plane 8 at a height H above the face 7.

The plate 7 further comprises a wall 9 which protrudes from the face 7, substantially encloses the plurality of burls 4, and has a substantially uniform height h above the face 4, whereby h<H. The wall is dimensioned to provide a "leaking" seal, that is, due to the small change in height, air is able to enter the room formed between the plane 8 and the face 7. In this way, a constant pressing force is generated that is able to hold the substrate pressed against the substrate holder.

Figure 3:
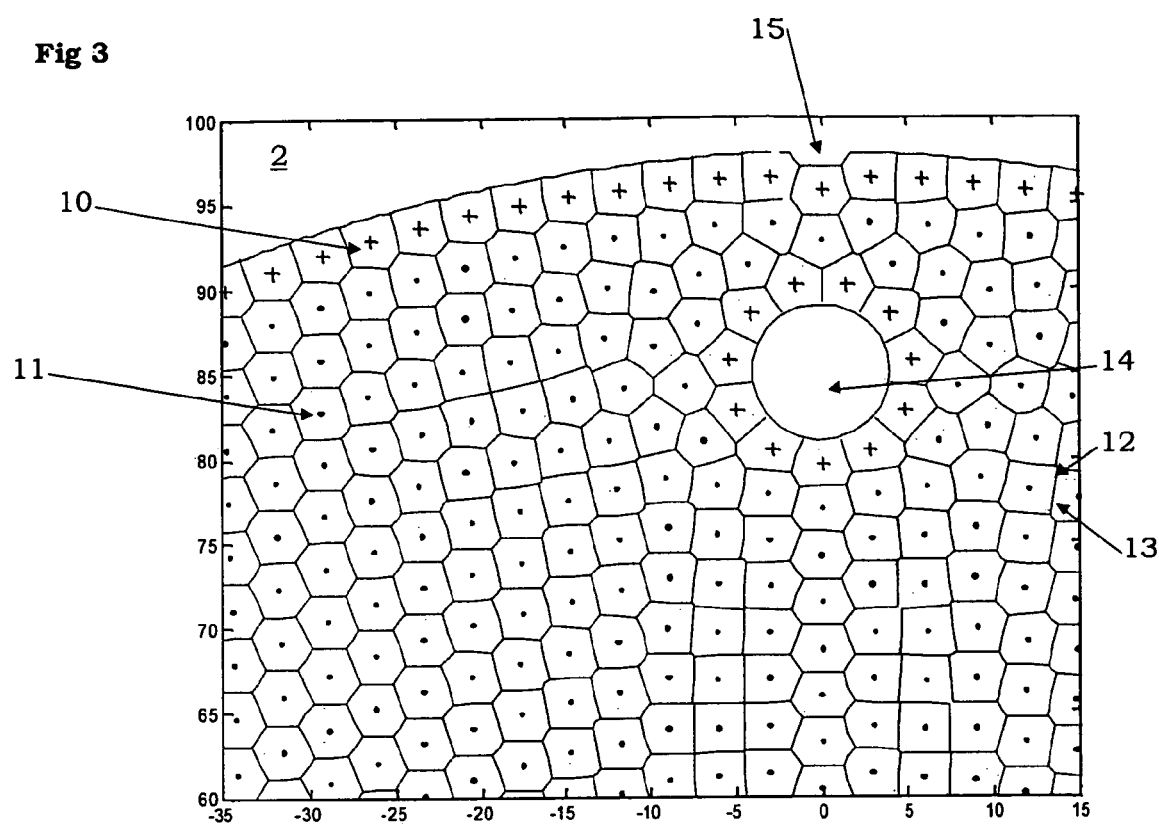
FIG. 3 depicts a plan view of a substrate showing a Voronoi diagram distribution according to the invention.

In FIG. 3 a fragment of the substrate holder 2 is shown in plan view. In the figure, the burls are depicted by crosses and dots. In FIG. 3, a pattern of burls is shown comprising an edge zone defined by the outer burls 10, all of which are depicted by crosses. The off edge-zone starts immediately next to the outer burls. In principle, such an off edge zone may extend further than a first ring and could extend to even five or ten rings, for example depending on the means used for pressing the substrate 3 to the substrate holder 2. As illustrated in FIG. 2, the distribution of the outer burls 10 with respect to the inner burls 11 may differ to compensate for edge effects caused by the edges of the wafer holder 2. Midway between the burls division lines 12 are drawn, demarcating a supporting area 13 for each burl. The set of all supporting areas defines a Voronoi diagram distribution that may alternatively be viewed as a collection of adjacent areas that are formed by division lines that divide a connecting line connecting each two neighboring protrusions midway. Since, viewed from a protrusion central to such an area, in relation to each neighboring protrusion, the load is divided in equal parts between the central protrusion and the neighboring protrusion, an even load results that is substantially equal for each supporting protrusion of said distribution of center protrusions. The burl distribution, also represented by crosses, for an opening 14 for access of an ejection pin (e-pin, not shown) is further demonstrated in FIG. 9. Such ejection pins are used for lifting the substrate 3 from the substrate holder 2 when loading or unloading the substrate 3. An other regularity may be an edge notch, indicated by reference 15, which is used to provide an orientation mark that is used by means for handling and/or transporting the substrate 3. Furthermore, there may be intrinsic irregularities that are caused to a basic shift in burl position to provide room for an integer number of extra protrusions per subsequent circle; while still maintaining the "Voronoi criterion" of the inventive photolithographic apparatus.

Figure 4:
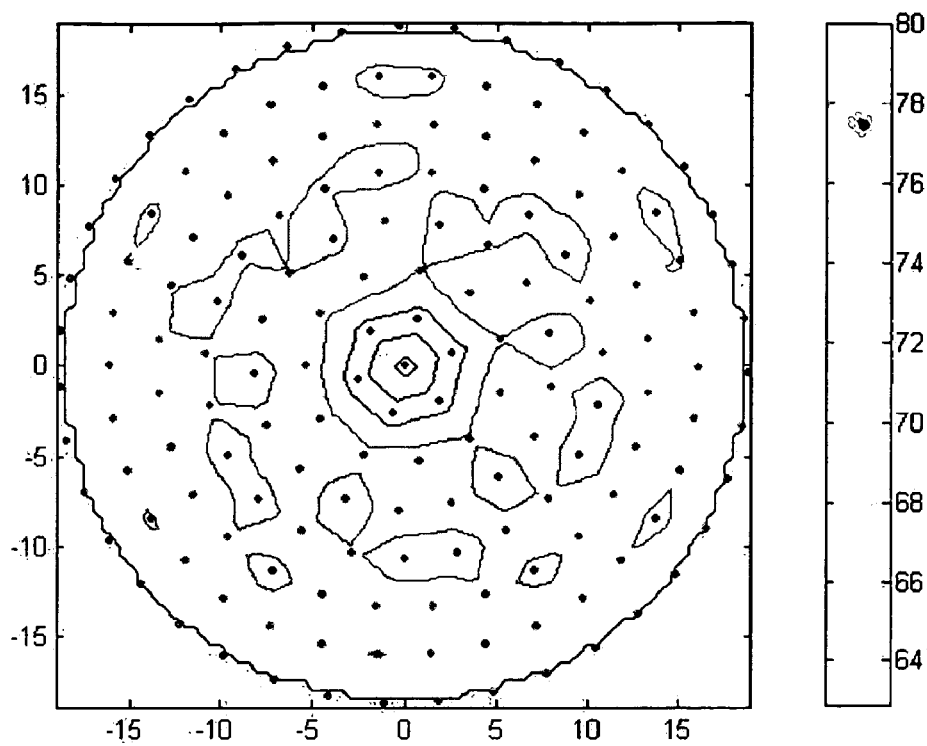
FIG. 4 depicts a height distribution for a prior art burl pattern.

FIG. 4 shows a detail of height distribution for a burl pattern that has equally spaced radii, resulting in a regular symmetric circular pattern of burls. In this example, the substrate holder is a substantially circular structure for supporting a substantially circular substrate. From this pattern, a height variation can be deduced wherein it is apparent that due to the force distribution on the supporting pins, the center region tends to "sag". This height variation is calculated by estimating the force exerted on the pins, which is relative to the "Voronoi" areas of each pin. In this model, the bending stiffness of the wafer is not included. Due to the force distribution, a local height variation in the wafer occurs of approximately 20 nm.

Figure 5:
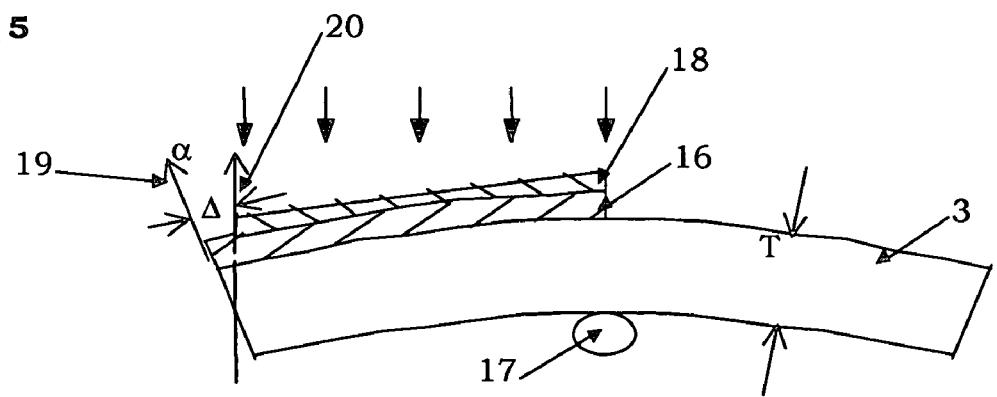
FIG. 5 depicts an overlay error due to a local bending of the substrate.

In FIG. 5 is depicted how an overlay error is generated due to local height variation. A substrate 3 having thickness T comprises a first layer 16. The substrate 3 is locally distorted by a dust grain 17 or the like, that introduces a bending of the substrate 3. In a subsequent photolithographic procedure, a next layer 18 is hence irradiated while the normal 19 is rotated over a small angle α with respect to the ideal flatness normal vector 20. As a result, a shifted layer is produced, having a overlay error of approximately rotation angle α of the normal times half the thickness T of the substrate.

Figure 6:
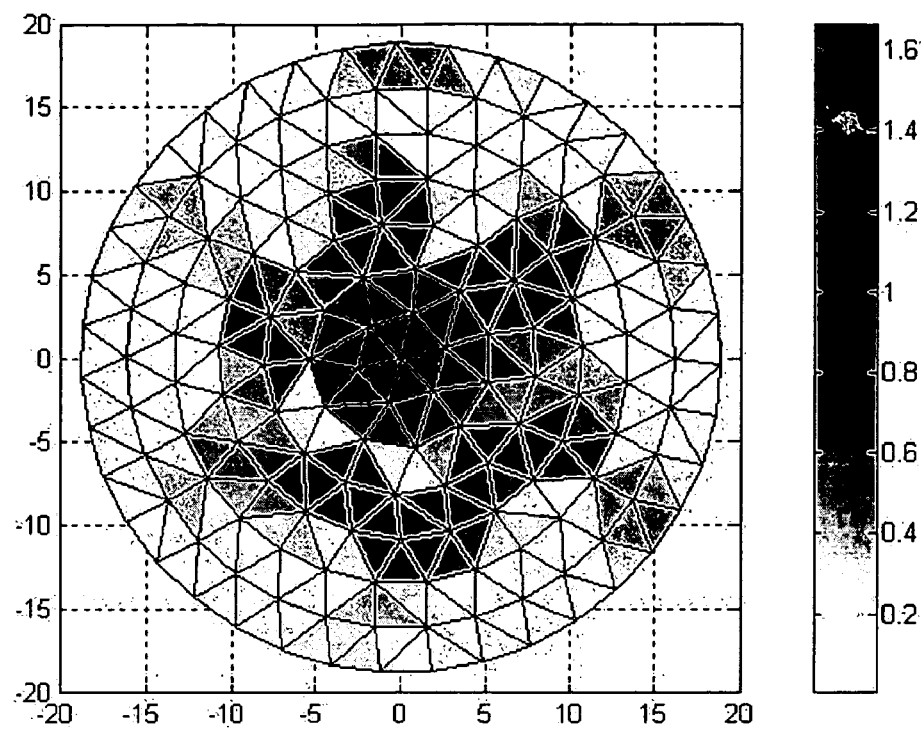
FIG. 6 depicts an overlay error distribution corresponding to the height distribution of FIG. 4.

FIG. 6 shows a first diagram of a overlay error distribution of the burl configuration of FIG. 4. From the figure, it becomes apparent that the overlay error is maximally 1.6 nm and is located near in the first hexagon center ring of the burl configuration. From this initial configuration in FIG. 4, various optimizations were generated to improve the overlay error distribution.

A first optimization comprised varying the radii of the polygonal/circular burl patterns around the center burl, to have non-equidistant radii to account for the Voronoi criterion so that the burls are distributed so as to provide a substantial equal supporting area for each protrusion. A second optimization comprised redesigning the central burl pattern.

Figure 7:
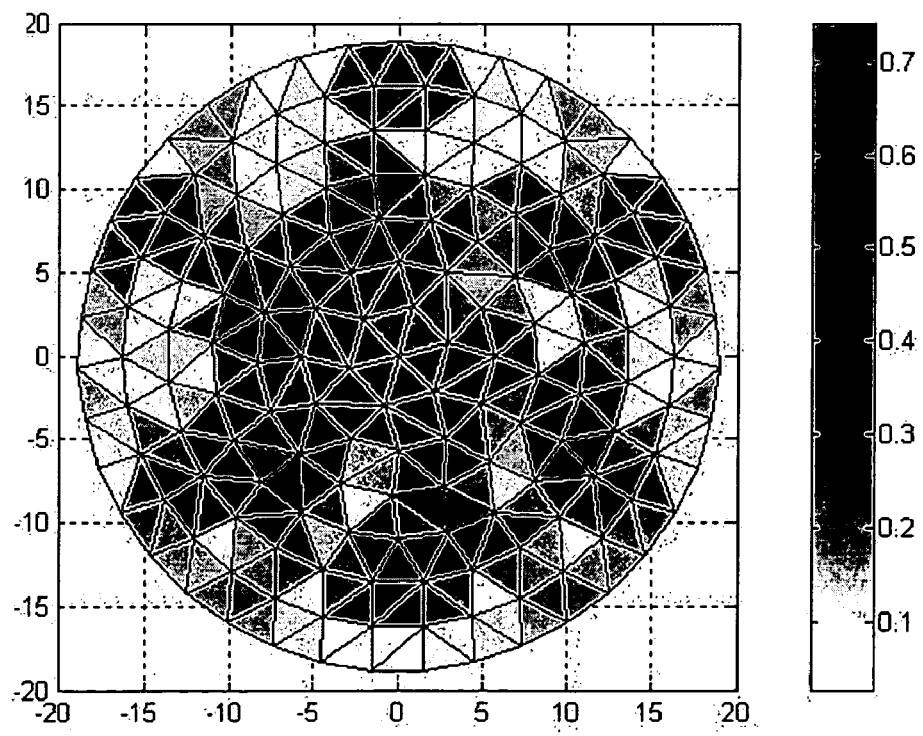
FIG. 7 depicts an improved overlay error distribution according to the burl pattern distribution of the invention.

FIG. 7 shows the result of these actions and illustrates a burl distribution having a reduced overlay error of maximally 0.7 nm. In this redesign the protrusions are distributed in substantially equilateral triangular patterns wherein the center protrusions are arranged according to a regular hexagonal shape and the second row of protrusions is arranged to have 12 burls oriented substantially symmetrical around said central hexagonally arranged protrusions. In such configuration the center hexagonal ring is viewed in the same position from each burl of the second row of 12 burls. The overlay error was reduced when the bending stiffness of the wafer was taken into account. In that case, the overlay error could be reduced by a factor three to four, depending on the position on the wafer. The maximal rotation is seen to be 0.69 urad, which equals 0.27 nm overlay error. Still further reduction of the overlay error is achieved when a reduced vacuum pressure of 0.2 bar instead of 0.5 bar is used. The overlay error than is seen reduced to less than 0.1 nm.

Figure 8:
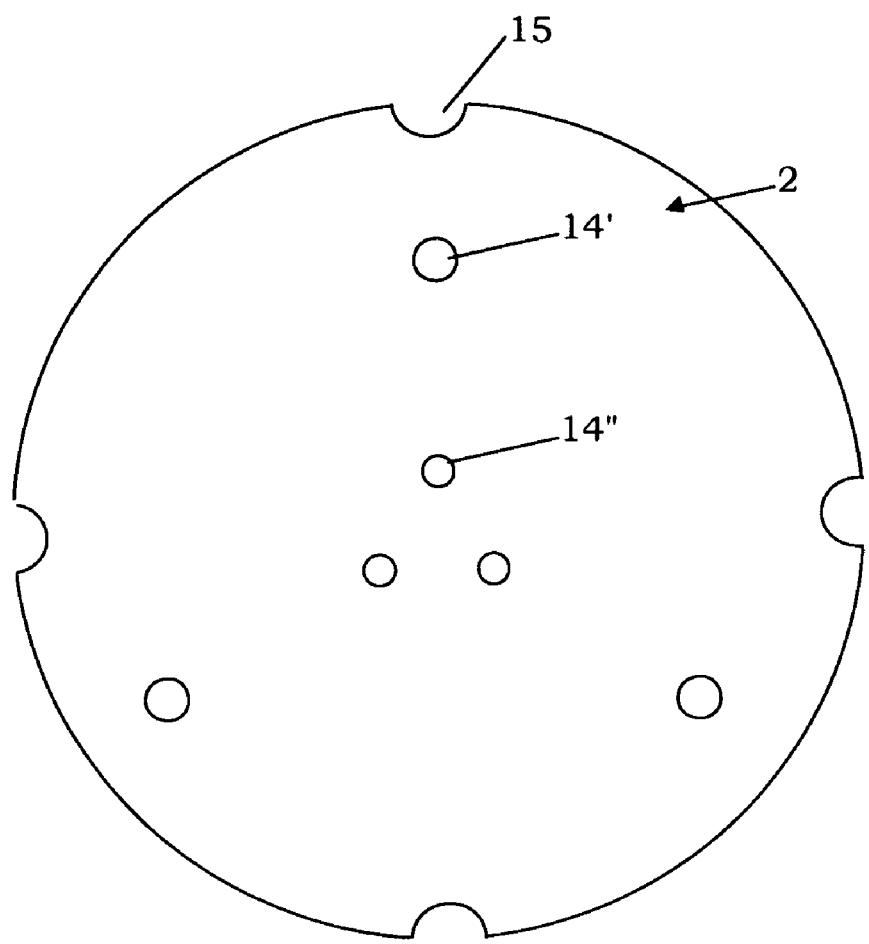
FIG. 8 depicts a substrate having openings for guiding ejection pins therethrough.

FIG. 8 shows a configuration for a substrate holder 2 having six ejection pin openings 14' and 14". In a conventional photolithographic apparatus, generally three ejection pins per wafer table are present for lifting the substrate from the wafer table. In the e-pin configuration of FIG. 8 a 2-multiple of three pins is present (six openings 14' and 14"). Due to the presence of such an N-multiple, the wafer support can be made independently of a specific photolithographic machine, which all have, due to various design requirements, a varying choice of e-pin locations. By the substrate coupled to the wafer-table to a reproducible location, a photolithographic process can be made independent of these varying e-pin locations, and focus-errors and overlay errors will be predictable and reproducible throughout a whole photolithographic routine, which consists of repeated etching and imaging of substrates in various machines. Furthermore such an N-multiple offers a specific advantage in so-called twin-systems, where alignment and imaging can be partly separated in two stages. In such systems, it is desirable for the overlay error to be repeatable. In an ejection pin layout used for a specific apparatus, the remaining openings are not used but are there as "dummy openings" for achieving a predictable and repeatable overlay error. Notably, at a location where due to a distortion the substrate area is shifted somewhat, yet the overlay error may be reduced or even absent when for all subsequent photolithographic actions, the shifting is identical. Hence, by providing a repeatable distortion of the substrate, the overlay error can be reduced further.

Figure 9:
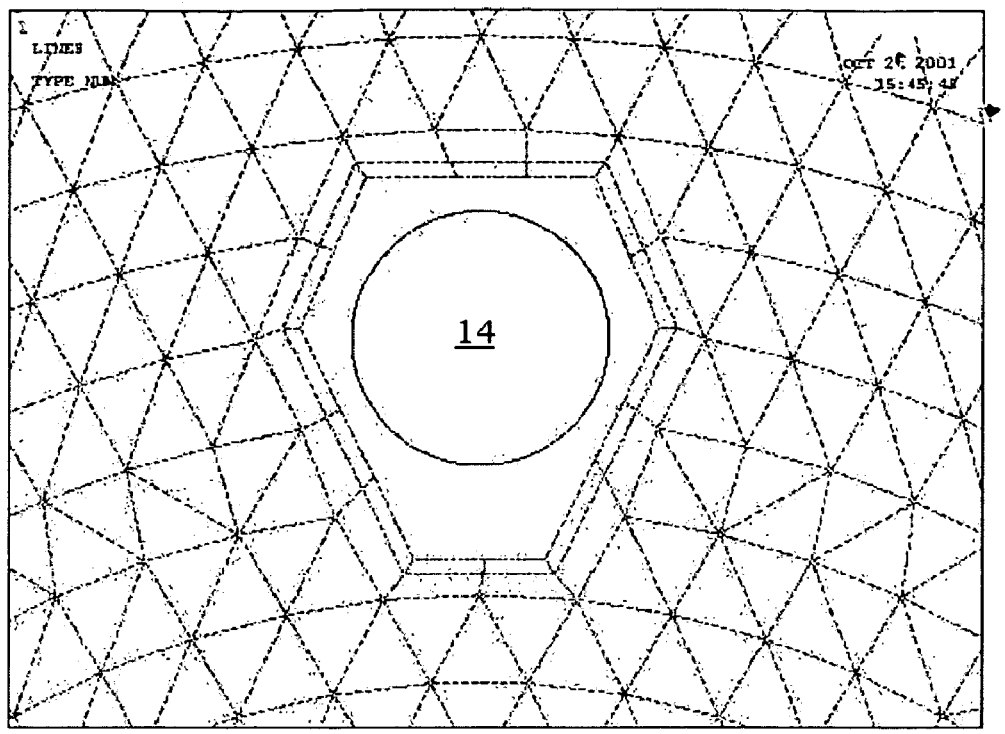
FIG. 9 depicts an improved burl distribution around an ejection pin opening.

FIG. 9 shows a detailed view of an improved burl pattern for an ejection pin opening 14 as illustrated in FIG. 8. According to the improvement, for a substrate holder 2 comprising six openings 14 as for example in FIG. 8, each of said openings defines an edge zone, wherein each concentric circle traversing said six edge zones comprises an integer number of six protrusions. In this way, the configuration of protrusions in the edge zone of an opening can be kept identical for all six ejection-pin openings. In this example, the edge zone may be defined by a number of rows enclosing the opening, preferably at least two or three rows. This resulted in equal patterns in the uniform burl pattern around the ejection-pin centers. The openings in FIG. 8 and FIG. 9 are sealed by leaking seals. The pressure is assumed to vary linearly over the 0.5 mm width of the seal, from maximum on the inside to zero on the outside. In the figure, the opening comprises a 8.255 mm diameter E-pin hole, all set inside the uniform burl pattern. The distance from the seal to the edge of the E-pin hole is in the order of 1 mm.

The focus error and overlay error distribution was calculated for this improved burl pattern, using a finite element analysis. It appeared that the focus error varied to a maximum of 13.5 nm for this design. The overlay error distribution amounted to maximally 2.7 nm near the edges. The disturbance of the overlay due to the presence of the openings introduced roughly 10% error compared to the above mentioned undisturbed substrate.

Figure 10:
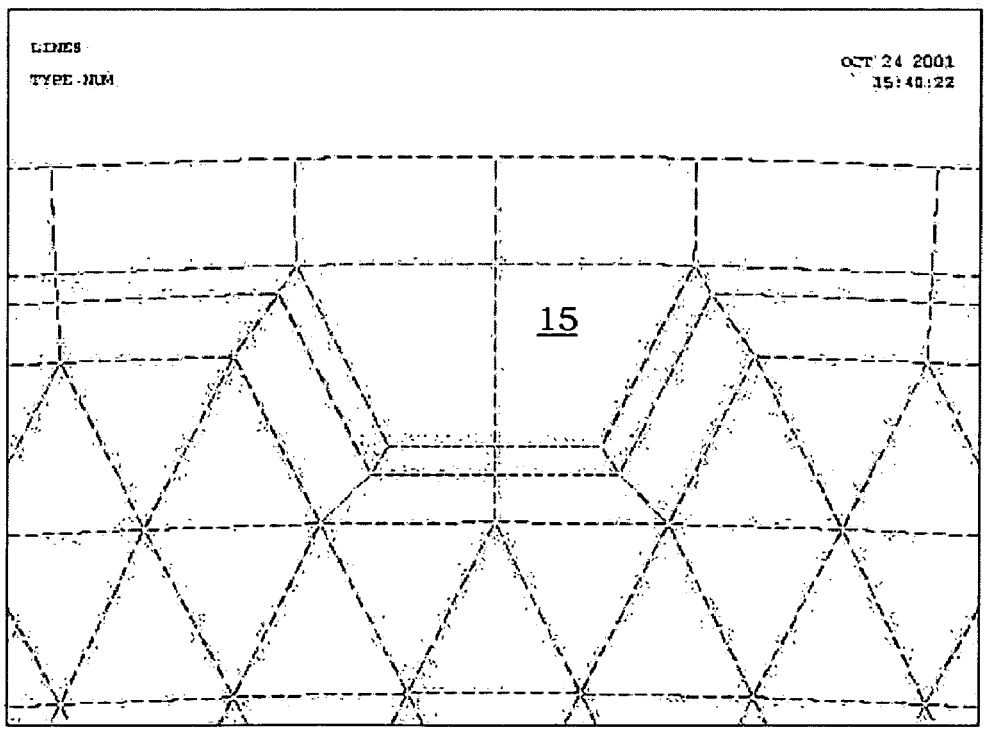
FIG. 10 depicts an improved burl distribution around a notch around a perimeter of a circular substrate.

FIG. 10 shows a detailed view of an improved burl pattern for a notch 15 present in an otherwise generally circular border of the substrate holder 2. According to the figure, for a substrate holder 2 comprising four notches, each of said notches, defining an edge zone, wherein each concentric circle traversing said four edge zones comprises an integer number of four protrusions. In this example, the edge zone may be defined by a number of rows enclosing the notch, preferably at least two or three rows. Again, the notch is sealed by a leaking seal. The wafer is sticking out freely beyond the last row of burls. Using a finite element analysis, for a wafer having a radius of 150 mm, for this notch configuration, the focus error was found to be less than 17 nm. The overlay error was calculated to be less than 3.1 nm.

Whilst specific embodiments of the invention have been described above, it will be appreciated that the invention may be practiced otherwise than as described. In the embodiments, the substrate holder and substrate have been shown to have a general circular form. However, other forms, such as square forms are also possible without departing from the scope of the invention. The description is not intended to limit the invention.

We claim:

1. A lithographic projection apparatus comprising:
a radiation system for providing a projection beam of radiation;
a support structure for supporting a patterning device, said patterning device serving to pattern said projection beam according to a desired pattern to form a patterned beam;
a substrate holder comprising protrusions, each of said protrusions having an extremity, said extremities of said protrusions defining a substantially flat plane of support for supporting a substantially flat substrate, said substrate holder provided with a clamp to provide a pressing force for pressing said substrate against said extremities of said protrusions; said protrusions in an edge zone of said substrate holder arranged to provide a substantially flat overhanging of said substrate in relation to said pressing force of said clamp; and
a projection system for projecting said patterned beam onto a target portion of said substrate, wherein said protrusions in an off-edge zone of said substrate holder are distributed so as to provide a substantially equal supporting area for said protrusions in said off-edge zone, said supporting area being defined by a Voronoi diagram distribution associated with at least a plurality of said protrusions.

2. A lithographic apparatus according to claim 1, wherein said substrate holder is a substantially circular structure for supporting a substantially circular substrate and wherein said protrusions are arranged in substantially concentric circles in a zone away from a central zone of said circular substrate holder; wherein at least some concentric circles are non-equidistant.

3. A lithographic apparatus according to claim 2, wherein said protrusions are distributed in substantially equilateral triangular patterns.

4. A lithographic apparatus according to claim 1, wherein center protrusions are arranged according to a central protrusion and a surrounding first row of protrusions is arranged in a regular hexagonal shape.

5. A lithographic apparatus according to claim 4, wherein a second row of protrusions is arranged to have 12 protrusions oriented substantially symmetrical around said first row of protrusions.

6. A lithographic apparatus according to claim 2, wherein said substrate holder comprises a plurality of N openings, each of said N openings defining a second edge zone, wherein each concentric circle traversing said N second edge zones comprises an integer number of N protrusions.

7. A lithographic apparatus according to claim 6, wherein said plurality of N openings is arranged in an N/3 multiple of sets of three symmetrically configured openings.

8. A lithographic apparatus according to claim 6, wherein said substrate holder comprises a plurality of M notches, each of said M notches defining a third edge zone, wherein each concentric circle traversing said M third edge zones comprises an integer number of M protrusions.

9. A lithographic apparatus according to claim 8, wherein said plurality of M notches is arranged in an M/3 multiple of sets of three symmetrically configured notches.

10. A lithographic apparatus according to claim 1, wherein said substrate holder further comprises a wall for providing a leak seal and wherein said clamp is a vacuum system that forms a vacuum pressure between said substrate holder and said substrate.

11. A lithographic apparatus according to claim 10, wherein said vacuum pressure ranges from 0.1 to 0.9 bar with respect to ambient pressure.

12. A lithographic apparatus according to claim 11 wherein said vacuum pressure ranges from 0.5 to 0.2 bar with respect to ambient pressure.

13. A lithographic apparatus according to claim 10, wherein a radial distance x between said wall and a circle of protrusions nearest thereto satisfies a relationship $0.3<x/d<0.6$, where d is a mutual radial separation of two circles of protrusions nearest to said wall.

14. A lithographic apparatus according to claim 1, wherein said edge zone is defined by at least one concentric circle of protrusions arranged nearest to an edge.

15. A lithographic apparatus according to claim 1, wherein said at least a plurality of said protrusions associated with said Voronoi diagram distribution is only located in said off-edge zone.

16. A lithographic apparatus according to claim 1, wherein said at least a plurality of said protrusions associated with said Voronoi diagram distribution includes protrusions located in said off-edge zone and protrusions located in said edge zone.

17. A substrate holder for a lithographic apparatus, comprising:
protrusions, each of said protrusions having an extremity, said extremities of said protrusions defining a substantially flat plane of support; and a clamp to provide a pressing force for pressing said substrate against said extremities of said protrusions; said protrusions in an edge zone of said substrate holder arranged to provide a substantially flat overhanging of the substrate in relation to said pressing force, said protrusions in an off-edge zone of said substrate holder being distributed so as to provide a substantially equal supporting area for said protrusions in said off-edge zone, said supporting areas being defined by a Voronoi diagram distribution.

18. A method of manufacturing a substrate holder for a lithographic apparatus, comprising:

providing a plate for supporting a substantially flat substrate;

distributing a first plurality of supporting protrusions in an off-edge zone of the plate so as to provide a substantial equal supporting area for the first plurality of supporting protrusions, extremities of each protrusion of the first plurality of supporting protrusions defining a substantially flat plane of support;

arranging a second plurality of supporting protrusions in an edge zone of the plate so as to provide a substantially flat overhanging of the substrate in relation to a force pressing the substrate against the projections; and calculating a supporting area distribution defined by a Voronoi diagram associated with the protrusions and keeping an area deviation of the supporting area distribution to a minimum.

19. A method according to claim 18, wherein the method further comprises:

a) calculating a height distribution of the substrate in correspondence with a pressure exerted on the substrate to press the substrate against the first plurality of distributions and to deform the protrusions locally in axial directions;

b) analyzing a focus error and an overlay error associated to the height distribution; and c) redistributing the first plurality of supporting protrusions in areas wherein either or both of the focus and overlay error exceeds a predefined maximum value; and d) repeating steps a–c in an iterative way.

20. A method according to claim 19, wherein the height distribution is calculated in correspondence with a finite element analysis of a bending stiffness of the substrate.

* * * * *